United States Patent [19]
Goldberg

[11] Patent Number: 5,164,671
[45] Date of Patent: Nov. 17, 1992

[54] HIDDEN RECONSTRUCTION

[75] Inventor: Shmuel Goldberg, Even Yehuda, Israel

[73] Assignee: Elscint Ltd., Haifa, Israel

[21] Appl. No.: 608,374

[22] Filed: Nov. 2, 1990

[30] Foreign Application Priority Data

Nov. 5, 1989 [IL] Israel .................................. 092212

[51] Int. Cl.⁵ ............................................ G01R 33/20
[52] U.S. Cl. .................................................. 324/309
[58] Field of Search ............... 324/300, 307, 309, 310, 324/311, 312, 313, 314, 318, 322; 128/653 A, 653 SC

[56] References Cited

U.S. PATENT DOCUMENTS

| | | | |
|---|---|---|---|
| 4,920,314 | 4/1990 | Satoh | 324/312 |
| 5,049,820 | 9/1991 | Briand et al. | 324/309 |
| 5,099,208 | 3/1992 | Fitzpatrick | 324/312 |

OTHER PUBLICATIONS

Introduction to Fast-Scan Magnetic Resonance, F. W. Wehrli, Ph.D.

Primary Examiner—Michael J. Tokar
Attorney, Agent, or Firm—Sandler, Greenblum & Bernstein

[57] ABSTRACT

A three dimensional imaging sequence that enables reconstruction during acquisition by acquiring all data required for imaging a plane perpendicular to the imaging plane and repeating for all such planes making up the three dimensional image.

9 Claims, 2 Drawing Sheets

1

HIDDEN RECONSTRUCTION

FIELD OF THE INVENTION

This invention is concerned with magnetic resonance imaging (MRI) systems and more particularly to such systems used for acquiring and reconstructing data for three-dimensional imaging purposes.

BACKGROUND OF THE INVENTION

Three-dimensional imaging using MRI equipment is inherently slow. Both the acquisition and reconstruction processes consume more time than equivalent two dimensional multi-slice acquisition and reconstruction. In fact because of the inherent slowness of three-dimensional imaging, such imaging is often avoided. However, since three-dimensional imaging can play a key role in such fields as angiography and volumetry it is worthwhile to speed up the three-dimensional imaging process; i.e., to make the 3-D imaging process including the acquisition and reconstruction more efficient.

In addition, three-dimensional techniques offer other benefits. For example, the three-dimensional techniques enable acquisition of very thin contiguous slices (down to 1 mm) with minimal inter-slice crosstalk and provide potentially high signal-to-noise ratios (SNR). SNR, as is well known, increases as the square root of the number of phase encodings (perpendicular to the image plane); therefore, a 32 slice three-dimensional scan has a little over five times the signal-to-noise ratio of its two-dimensional counterpart, assuming all other parameters to be equal.

The potential usefulness of three-dimensional imaging has inspired those skilled in the art to adapt many of the fast scan procedures to three-dimensional imaging. For example, in an article entitled "Introduction to Fast Scan Magnetic Resonance" by Felix W. Wehrli, Ph.D., The General Electric Company's Gradient recall fast scan technique is described as being applied to three-dimensional volumetric data acquisition.

In addition to speeding up the acquisition, those skilled in the art are searching for ways of speeding up reconstruction or improving the reconstruction efficiency in three-dimensional imaging procedures. Accordingly, it is an object of the present invention to maximize the efficiency of the three-dimensional reconstruction techniques.

Efficiency of three-dimensional imaging is measured by:
1) the time to the appearance of the first image measured from the completion of the acquisition, and
2) the rate of appearance of images.

BRIEF DESCRIPTION OF THE INVENTION

An object of the present invention is to increase the efficiency of three-dimensional imaging.

A more detailed object of the present invention is to obtain the appearance of images on the console as soon as possible following the acquisition. This object is achieved by acquiring the raw data so that reconstruction can be performed during acquisition without increasing the acquisition time.

In accordance with a broad aspect of the present invention a three-dimensional imaging sequence is provided wherein the XY plane of an arbitrary orthogonal XYZ system coincides with the image plane and wherein Nx, Ny, and Nz are acquisition matrix dimensions in the X, Y and Z directions, said three-dimensional imaging sequence comprising the steps of:

(a) subjecting the patient to a large static magnetic field to align "spins" in the patient with the large static magnetic field,
(b) applying an RF pulse to "tip" spins from their aligment with the large static magnetic field,
(c) applying an encoding gradient pulse in the Y direction,
(d) applying an encoding gradient pulse in the Z direction,
(e) applying a frequency encoding gradient pulse in the X direction to generate FID signals in the patient,
(f) receiving, sampling and recording said FID signals from the patient,
(g) repeating steps (b)–(f) Nz times with the same Y encoding gradient pulse in step (c) and Nz different Z encoding gradient pulses in sted (d),
(h) Fourier transforming the FID signals in the Y direction Nx times,
(i) recording the results in Nz separate two-dimensional matrices, each matrix corresponding to an image in the XY plane,
(j) repeating steps (b)–(i) Ny times with different Y encoding gradient pulses in step (c) and each time recording additional results into the Nz separate matrices,
(k) selecting an Nz matrix for processing,
(l) Fourier transforming the data in the selected matrix in both dimensions to obtain image data,
(m) using the image data to provide an image, and
(n) repeating steps (k)–(m) for all Nz matrices until all Nz XY images are reconstructed.

According to another feature of the present invention, the acquisition and reconstruction efficiency in three-dimensional imaging procedures are substantially improved by accomplishing reconstruction during acquisition.

A related object of the present invention is to use fast Fourier transforms in the reconstruction sequence rather than discrete Fourier transforms.

Yet another related object of the present invention is to speed up the process even more by using single side encoding.

BRIEF DESCRIPTION OF THE DRAWINGS

The above named and other objects and features of the present invention will be best understood when considered in the light of the following description of the broad aspect of the present invention wherein.

GENERAL DESCRIPTION

Figure 1:
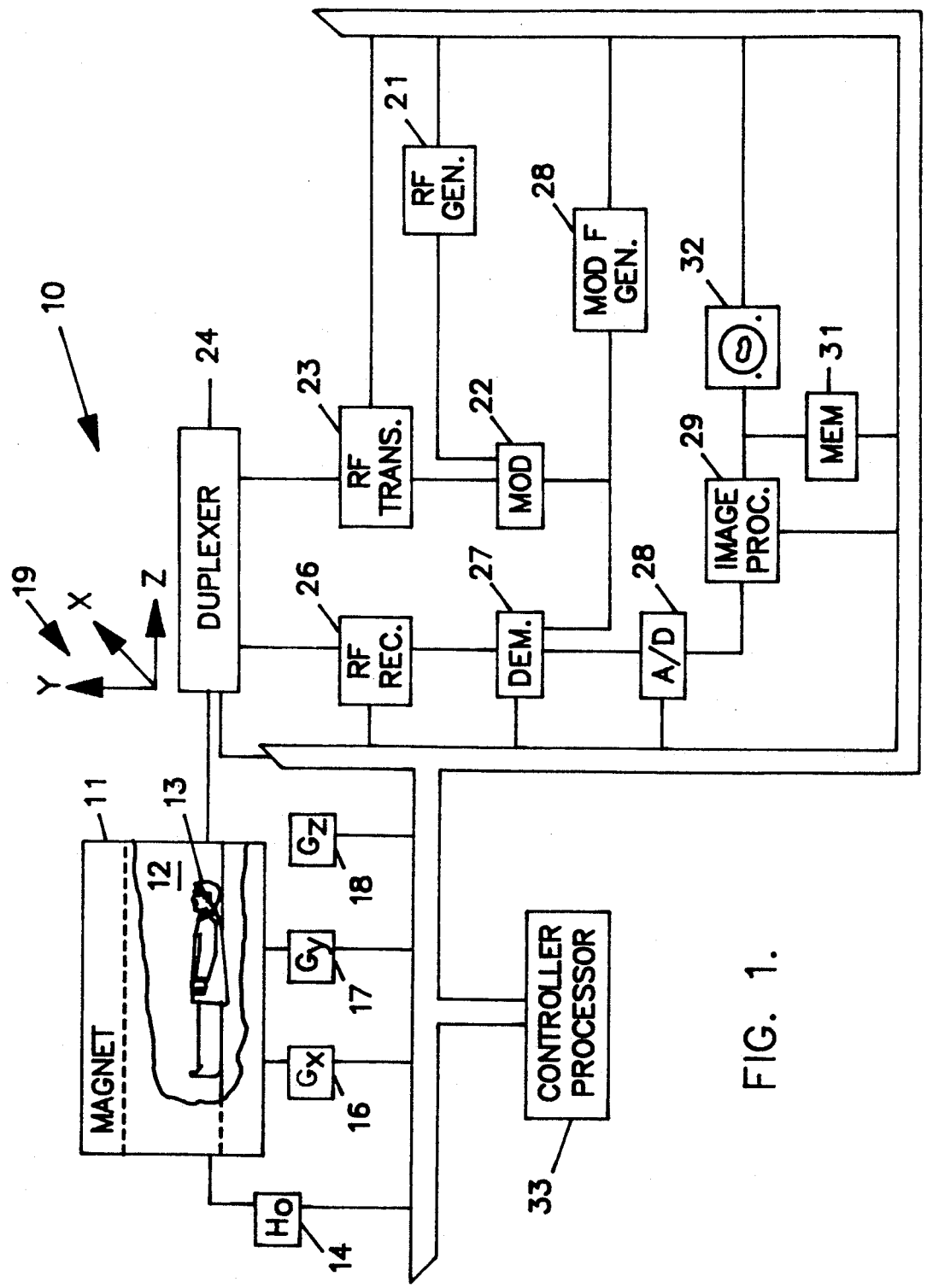
FIG. 1 is a block diagram showing of typical MRI system for using the reconstruction and acquisition method of the invention.

In FIG. 1, a typical MRI system 10 is shown including a magnet 11 for generating a large static magnetic field. The magnet is sufficiently large to have an air temperature bore 12 therein which enables a patient 13 to assume a prone position in the magnet. The large static magnetic field causes hydrogen protons in the patient 13 to align with the large static magnetic field.

The large static magnetic field is shown as being generated by magnetic generator Ho bearing the number 14.

Means are provided for locating signals arising within the patient in the magnet. More particularly, gradient generators are provided for generating gradient fields in the X, Y, and Z directions. The gradient generator Gx which generates a gradient field in the X direction is labelled 16. The gradient generator which generates a gradient of the large static magnetic field in the Y direction is labelled 17 while the gradient which provides a gradient in the direction of the large static magnetic field Gz bears the number 18.

Means are provided for transmitting a radio frequency (RF) pulse to "tip" the aligned spins to at least have a projection that is orthogonal to the large static magnetic field. In a typical system the large static magnetic field is in the Z direction. The X, Y and Z axes of a typical system are shown at 19. In this description, however, the imaging plane is the XY plane and the magnetic field is not directionally defined. The typical system and the system of this description coincide with axial images.

The means which are provided for transmitting the RF field includes a radio frequency generator 21 which supplies a radio frequency signal to a modulator circuit 22. The modulated radio frequency signal is transmitted by the RF transmitter 23 through a duplexer 24 into a radio frequency coil not shown located within the magnet 11. The duplexer is used to switch between the transmitting and receiving states of the system.

In the receiving mode, FID signals are detected by an RF coil not shown within the magnet. As used herein FID signals include echo signals. The same RF coil used for transmitting may also be used for receiving. The received signal is switched through duplexer 24 to the RF receiver 26 and from the RF receiver 26 to a detector or demodulator 27.

The modulator and demodulator may both use signals generated by a modulating frequency generator 28.

The received analog signals are fed to an analog-to-digital converter 28. The digital output of the analog-to-digital converter is sent to an image processor 29. The image processor includes, in the scope of this invention, Fourier transform means for Fourier transforming and processing the raw data to provide image data. Memory 31 is used during this processing. The image data is sent to a display device 32 to display the acquired and reconstructed image.

Thus, the imaging sequence includes acquisition and reconstruction. The reconstruction step is accomplished in the image processor. All of the operations of the system components and the timing thereof are controlled by a control processor shown at 33. Thus, the processor means 34 is shown connected to each of the components of the system.

Figure 2:
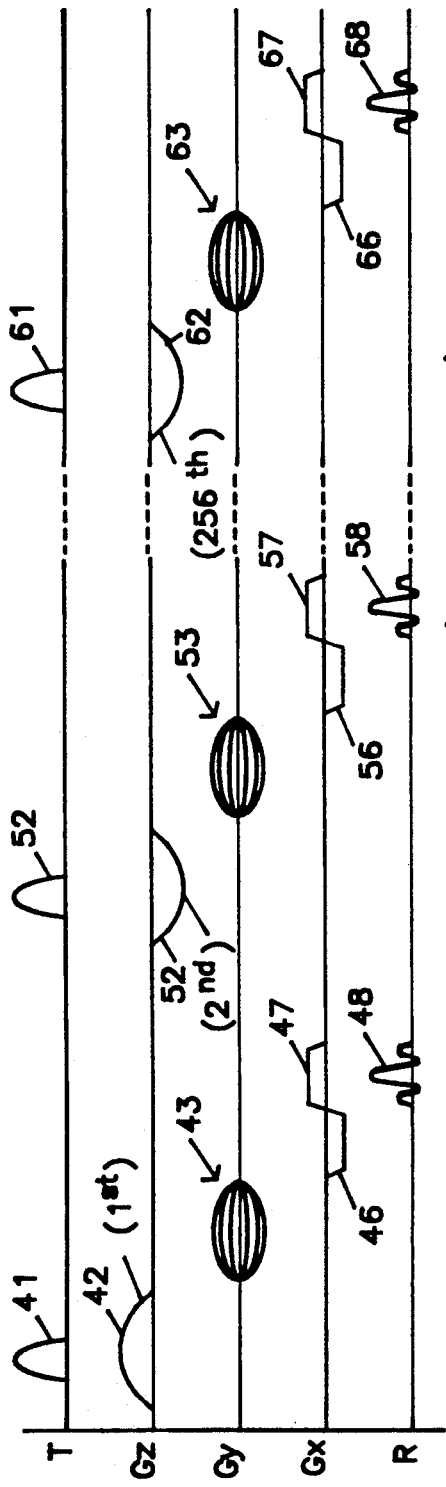
FIG. 2 is a showing of a prior art scan sequence for three-dimensional imaging.
Figure 3:
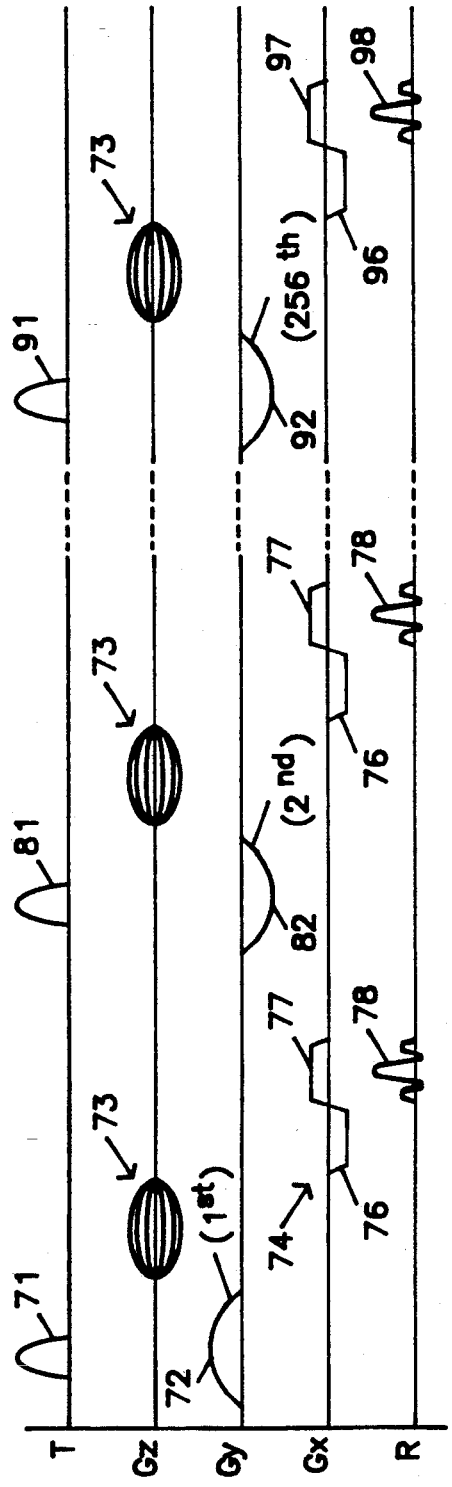
FIG. 3 is a showing of the scan sequence for three-dimensional imaging according to the present invention.

In the prior art as shown in FIG. 2, a three-dimensional scan sequence is illustrated. A fast scan procedure is shown in FIGS. 2 and 3. It should be noted that while a gradient recall fast scan procedure is shown any of the well known fast scan acquisition procedures can be used in place of the gradient recall procedure within the scope of this invention.

In the prior art sequence, the signals per voxel per view gradient contain overlapping data acquired from the entire volume in each of the voxels. Only by acquiring all the data and utilizing a number of equations equivalent to the number of voxels $[N_x + N_y + N_z(N_x + N_y)]$ is it possible to solve the equations and thereby to provide discrete image data for each of the voxels.

In accordance with the prior art procedures, acquisition and reconstruction could not overlap. Thus, first acquisition was performed and only then was the reconstruction performed. The acquisition in general first acquired data for voxels in a first widened XY plane; i.e., an XY plane having a width. The data for voxels sequentially subsequent to the first XY plane were then acquired until the voxel data for a complete volume of interest were acquired.

This type of scan sequence is shown in the prior art diagram of FIG. 2. In the scan sequence of FIG. 2 there is shown the application of a first RF pulse 41 during the application of a first Gz phase encoding gradient pulse 42. Subsequently a first Gy phase encoding gradient pulse of a sequence of Gy phase encoding gradient pulses 43 is applied. Then the Gx frequency encoding gradient pulses 44 are applied with the Gx gradient pulses comprising a negative-going portion 46 and a positive-going portion 47.

When the area under the portion 47 is equal to the area under portion 46, an echo signal shown at 48 is developed. The echo signal is sampled to provide signal values for each column of a row of voxels in a matrix corresponding to the volume of interest. The row is determined by the Gy phase encoding gradient pulse 43 and the column is determined by the sampling along the time domain axis of the signal 48.

The next sequential phase encoding Gy gradient pulse is applied during the application of the same Gz gradient pulse 42 to excite another row of spins. The dephasing and phasing Gx gradient pulses are applied to generate another echo signal which is sampled to provide signal values for each column of the another row. This process is repeated with the Gz gradient pulse of the same amplitude and Gy gradient pulses of different amplitudes until all of the voxels 256×256, for example, in the plane determined by the first Gz encoding gradient pulse have data. This data is raw data that is not discrete to the particular voxel, but includes input from the different voxels. In order to obtain actual discrete values, all of the values in the Z direction must be determined so that all of the simultaneous reconstruction equations can be solved to provide the discrete values required for the images.

In the prior art scan sequence of FIG. 2, the signals from one complete XY plane having a thickness dimension in the Z direction are acquired using the first Gz phase encoding gradient pulse. Then, a Gz phase encoding gradient pulse 52 of another amplitude (or area) is applied during the application of an RF pulse 51. Again, a series of Gy phase encoding gradient pulses 53 of different amplitudes (or areas) are applied with the second Gz gradient pulse signals 58. Voxel data is acquired by applying Gx frequency encoding pulses comprising pulses 56 and 57. This process is repeated until all of the voxels (256×256×32, for example) of all of the volume of interest have signal information therein. For example, the 256th acquisition is shown by the application of the RF pulse 61 during the application of the 32nd of the Gz gradient pulses 62. A series of 256 Gy gradient pulses 63 are applied. Gx gradient pulses 66 and 67 are used to generate the signal 68. In the example used, there are 256 voxels in the X direction, 256 rows of voxels in the Y direction and 32 sets of voxels in the Z direction.

In the past, reconstruction generally was not started until the acquisition was done. It was certainly possible in the prior art method shown in FIG. 2 to do the Fourier transforms in the X and Y directions during the acquisition process. However, it was not possible to do the Fourier transforms in the Z directions until the step shown in FIG. 2 has been repeated 32 times to obtain all of the data for the Fourier transforms in the Z direction. Thus, the Z direction Fourier transforms required 256×256 Fourier transform in the Z direction along 32 points or a total of 65,556 transforms of 32 points. There are 256×32 transforms of 256 points or 8,192 transforms of 256 points each in each of the X and Y directions.

A further drawback in doing the acquisition of this method; i.e., first applying a Gz gradient of a single amplitude while applying a series of phase encoding gradients, is that no images can be provided until the acquisition is completed and the reconstruction accomplished, if some of the reconstruction; i.e., X and Y transforms are performed during the acquisition process.

In accordance with the object to reduce the time from the moment the acquisition has been finished until the first image is reconstructed and appears, the sequence in FIG. 3 is shown. Therein a radio frequency pulse 71 is applied during the application of a first Gy phase encoding gradient pulse 72. Then a first Gz gradient pulse of a series of Gz pulses 73 is applied. An echo 78 is generated responsive to Gx gradient pulse 74 comprising a negative-going portion 76 and a positive-going portion 77. This is repeated for 32 different Gz gradient pulses in the sequential series of gradient pulses 73.

The method of this description is illustrated in FIG. 3 by the showing of the application of the radio frequency pulse 81 during the application of a second phase encoding gradient pulse Gy 82. A second phase encoding gradient pulse series 73' of gradient pulses Gz is applied following the application of the RF pulse 81 and the application of a second Gy phase encoding gradient pulse 82 of a different amplitude (or area) than the first Gy phase encoding gradient pulse. A plurality of signals are acquired through the use of the Gx frequency encoding gradient pulses 76 and 77. The different signals are illustrated by the signal shown at 78.

These steps are repeated until all 256 Gy phase encoding gradient pulses have been applied. This is illustrated in FIG. 3 by the application of the RF pulse 91 during the application of the 256th Gy phase encoding gradient Gy pulse 92. All of the Gz gradient pulses of the series of the gradient pulses 73 are applied to obtain the different extended rows of signal data. Responsive to the application of the Gx gradient pulses 96 and 97 the signal 98 is generated and sampled to provide data extending along the ZX planer direction.

During the acquisition, illustrated in FIG. 3, as distinguished from the prior art acquisition of FIG. 2, the Fourier transform in the Z direction can be performed for each row of Y and each column of Z data. Since the Z Fourier transforms require the most time (256×256 32 point transforms); i.e., approximately 400 seconds accomplishing the Z direction transforms during the acquisition results in a substantial saving of time. When all the acquisition is done, then the remaining reconstruction requires only 256 transforms in the X direction of 256 points and 256 transforms in the Y direction of 256 points, repeated for 32 planes (32×(256+256) transforms total). This is a total of about 16,384 transforms which takes about 80 seconds (32 of 2½ seconds each). If more than 32 points are used in the Z direction, then the fast Fourier transforms can be used efficiently rather than discrete Fourier transforms.

Using the above noted criteria for measuring the efficiency of three-dimensional reconstruction, the following Table 1 compares different reconstruction techniques used in three-dimensional reconstruction of a 32×256×256 matrix. More particularly, the prior art discrete Fourier transform is compared to two versions of the invention; i.e., Discrete Fourier Transform plus Hidden Reconstruction and Fast Fourier Transform plus Hidden Reconstruction.

TABLE I

3D Reconstruction of 32 × 256 × 256 Matrix

| Reconstruction | Acq. Time | Time to first image | Rate of images appearance | Time consumption following acquisition |
|---|---|---|---|---|
| Prior Art (DFT) | 300 sec | 251 sec | 2.5 sec | 331 sec |
| Proposed (DFT + Hidden Reconstruction) | 300 sec | 3 sec (251) | 2.5 sec | 83 sec (331) |
| Proposed (FFT + Hidden Reconstruction) | 300 sec | 3 sec (54) | 2.5 sec | 83 sec (131) |

(Numbers in parenthesis are actual time consumption; since they represent times when reconstruction is occurring during acquisition such times are not apparent to the operator).

The advantages of the present system is that because reconstruction is hidden that is accomplished in the "shadow" of acquisition, it takes significantly less time to complete a study even though acquisition and reconstruction take the same amount of time. In addition, once acquisition has been finished, images start to appear within seconds, rather than minutes. The quality of the images are believed to be better since the neighboring Y cycles are separated by greater amounts. The overlapping acquisition and reconstruction system wherein the Z Fourier transform is accomplished during acquisition can be used also in multi-volume, multi-echo and composite three-dimensional scans.

While the invention has been described in relation to a given embodiment, it should be understood that this description is made by way of example only and not to limit the scope of the present invention which is defined by the following claims.

What is claimed:

1. A three-dimensional magnetic resonance imaging sequence comprising the steps of:
    acquiring data and reconstructing an image of a patient using the acquired data,
    said step of acquiring data comprising:
    subjecting the patient to a static magnetic field large enough to align "spins" in the patient with the static magnetic field,
    applying RF pulses to a section of the patient to generate an RF magnetic field rotating at a Larmor frequency and having a time and amplitude characteristic sufficient to "tip" the spins aligned with the static magnetic field,
    applying phase encoding gradient pulses to the section of the patient, the applied phase encoding gradient pulses being perpendicular to said static magnetic field, applying frequency encoding gradient pulses to said section of the patient simultaneously with the application of the RF pulses to generate FID signals, said frequency encoding gradient pulses being perpendicular to the phase encoding pulses and to the static magnetic field, receiving and sampling said free induction decay (FID) signals, recording data obtained by sampling said FID signals, said reconstructing step comprising:

processing the data obtained including Fourier transforming the data obtained to obtain image data, and applying the pulses in a manner to enable reconstruction during the acquisition steps, said step of applying the pulses in a manner to enable reconstruction during the acquisition step comprising the steps of:

acquiring all of the signals required for reconstructing a plane perpendicular to the imaging plane, repeating the step of acquiring all the signals required for a plane perpendicular to the imaging plane until sufficient signals for such planes have been acquired, thereby enabling reconstruction portions of the image on the imaging planes during the acquisition procedure.

2. The three-dimensional imaging sequence of claim 1 wherein reconstruction is accomplished by Fourier transforming the raw image data during acquisition in the direction perpendicular to the imaging plane.

3. The three-dimensional imaging sequence of claim 2 wherein discrete Fourier transforms are used.

4. The three-dimensional imaging sequence of claim 2 wherein fast Fourier transforms are used during the reconstruction step.

5. The three-dimensional imaging sequence of claim 1 wherein single side encoding acquisition is used to further speed up the data, acquisition and reconstruction process.

6. A three-dimensional imaging sequence in the X, Y plane of an arbitrary XYZ orthogonal system which coincides with the image plane and where Nx, Ny and Nz are acquisition matrix dimensions in the X, Y and Z directions respectively, said 3-dimensional imaging sequence comprising the steps of:

(a) subjecting a patient to a static magnetic field extending in the Z-direction and large enough to align "spins" in the patient with the large static magnetic field, (b) applying an RF pulse to a section of the patient being imaged, said RF pulse having a frequency and amplitude so as to tip spins from being aligned with the static magnetic field, (c) applying an encoding gradient pulse to the section of the patient, said encoding gradient pulse being perpendicular to the static magnetic field, said encoding gradient pulse being in the Y-direction, (d) applying an encoding gradient pulse in the Z-direction where the encoding gradient pulse is perpendicular to both the encoding gradient pulse in the Y-direction and to the static magnetic field, said encoding gradient pulse being applied to the section of the patient, (e) applying a frequency encoding gradient pulse in the X-direction to generate FID signals in the patient, said frequency encoding gradient pulse being perpendicular to the encoding gradient pulse in the Y-direction and to the encoding gradient pulse in the Z-direction and being applied to the section of the patient, (f) receiving and sampling said FID signals from the patient, (g) recording the sampled FID signals, (h) repeating steps (c)–(g) Nz times with the same Y encoding gradient pulse in steps (c) and Nz different Z encoding gradient pulses in step (d), (i) Fourier transforming the FID signals in the Z-direction in X times, (j) recording the results in Nz separate 2-dimensional matrices, each matrix corresponding to an image in the X, Y plane, (k) repeating steps (d)–(j) Ny times with different Y encoding gradient pulses in step (c) and each time recording different additional results into the separate and matrices, (l) selecting one of the Nz matrices for 2-dimensional processing, (m) said processing step including Fourier transforming the data in the selected matrix in both dimensions to obtain image data, (n) using the image data to provide an image, and (o) repeating steps (l)–(n) until all Nz images are reconstructed.

7. The three-dimensional imaging sequence of claim 6 wherein said Fourier transforming comprises using discrete Fourier transforming.

8. The three-dimensional imaging sequence of claim 6 wherein the step of Fourier transforming comprises fast Fourier transforming.

9. The three-dimensional imaging sequence of claim 6 including the step of using single side encoding.

* * * * *